United States Patent
Takano et al.

(12) 
(10) Patent No.: US 6,214,468 B1
(45) Date of Patent: Apr. 10, 2001

(54) FLAME RETARDANT EPOXY RESIN COMPOSITION FOR PRINTED BOARD, AND PREPREG AND METAL FOIL CLAD LAMINATE USING THE SAME

(75) Inventors: Nozomu Takano, Yuuki; Michitoshi Arata, Shimodate; Hikari Murai, Shimodate; Yoshiyuki Takeda, Shimodate, all of (JP)

(73) Assignee: Hitachi Chemical Company, Ltd., Tokyo (JP)

( * ) Notice: Subject to any disclaimer, the term of this patent is extended or adjusted under 35 U.S.C. 154(b) by 0 days.

(21) Appl. No.: 09/238,734

(22) Filed: Jan. 28, 1999

(30) Foreign Application Priority Data

Jan. 29, 1998 (JP) .................................................... 10-16839

(51) Int. Cl.$^7$ ...................................................... B32B 27/38
(52) U.S. Cl. ........................... 428/418; 525/489; 156/330
(58) Field of Search ........................... 525/489; 428/418; 156/330

(56) References Cited

FOREIGN PATENT DOCUMENTS 63-36621 B2    7/1988   (JP) .
63-54300 B2   10/1988   (JP) .
05222221    *   8/1993   (JP) .

* cited by examiner

Primary Examiner—Robert Dawson
Assistant Examiner—D. Aylward
(74) Attorney, Agent, or Firm—Evenson, McKeown, Edwards & Lenahan, P.L.L.C.

(57) ABSTRACT

A flame retardant epoxy resin composition which can improve heat resistance and exhibit an excellent adhesion strength and insulation reliability when applied to a printed circuit board or to a multilayered interconnection laminate is provided, and a prepreg and a metal foil clad laminate using the same composition are manufactured. This flame retardant epoxy resin composition consists of: (a) an epoxy resin containing a glicidylether compound which is a condensate of bisphenol A or bisphenol F with formaldehyde; (b) a condensate of bisphenol A with formaldehyde; (c) halogenated bisphenol A as a flame retardant agent; and (d) a hardening accelerator, wherein the haloganated bisphenol A is contained in 45 weight % or less of a total solid resin weight. A metal foil clad laminate is provided using this composition as a varnish, impregnating the same into a base material to obtain the prepreg, laminating the prepreg, depositing a metal foil on one or both surfaces thereof, and heating under pressure.

11 Claims, No Drawings

FLAME RETARDANT EPOXY RESIN COMPOSITION FOR PRINTED BOARD, AND PREPREG AND METAL FOIL CLAD LAMINATE USING THE SAME

FIELD OF THE INVENTION

The present invention relates to a flame retardant epoxy resin composition for printed boards for use in a metal foil clad lamination board or a multilayer interconnection board.

DESCRIPTION OF RELATED ART

With an increasing need for further compactness and improved performance of electronics devices, developments of laminates for use in printed circuit boards are progressing aiming at a greater number of lamination and a thinner sheet of laminates, minimization of hole gaps by reducing throughhole diameters, and inter-insulation distances by reducing line widths. On the other hand, packaging techniques for packaging very thin low thermal expansion parts which include a flip-chip packaging to mount bare chips directly on the laminates and Thin Small Outline Package (TSOP) are increasing rapidly, thereby demanding a substantially improved and excellent package level reliability than ever before. Therefore, further improvements in adhesiveness with metal foils and glass, insulation reliability to be ensured with substantially reduced inter-insulation distances, as well as in the heat resistance are becoming important characteristics to be addressed.

Epoxy resins have been widely used as insulation materials for printed circuit boards. As a curing agent therefor, dicyandiamide is normally used which has an excellent adhesion with the metal foil and a good pot life stability.

However, dicyandiamide has such disadvantages that because it is not compatible with epoxy resin, dicyandiamide is likely to precipitate when used in a prepreg, and in addition that a printed circuit board prepared using this curing agent has a low softening temperature, thereby easily causing smear or resin contamination of interconnection circuit copper during drilling, and also that its long-term heat resistance is inferior. Still further, because its cured substance has a high moisture absorption rate, it is difficult for this material to be used as a substrate for packaging which must avoid moisture absorption. In addition, this high moisture absorption rate easily causes the occurrence of metal migration, thereby introducing a major cause to deteriorate the insulation reliability in fine patterned wiring.

This metal migration is a phenomenon in which metals that constitute insulation materials, interconnections or circuit patterns within insulation materials are caused to migrate and precipitate on the insulation materials or inside thereof due to a potential difference under a high moisture environment.

As good migration resistant resins, there are known bismaleimide-triazine resin and polyimide resin. These resins, however, have such disadvantages that their curing contraction is large, adhesiveness is low, and they are too hard and brittle and so on. JP No.63-54300 discloses a method of adding a triazine compound as a migration inhibitor to the epoxy resin. However, it is difficult for the triazine compound to be dispersed uniformly, thereby causing a large variation in resultant properties.

On the other hand, as a means to solve these problems associated with the prior art, JP No. 63-36621 discloses a composition of a phenol curing group. A cured compound using the phenol curing group, in particular, using a high orthophenol-formaldehyde resin selected therefrom has an excellent discoloring property, and exhibits a high glass transition temperature (hereinafter referred to as Tg). However, any cured resin that has a high Tg tends to become hard and brittle, thereby easily lowering adhesion with metal foils, and causing a crack (peel-off) in the boundary between glass fiber and the resin during drilling and molding. This crack or peel allows permeation of plating substances and of water contents absorbed, thereby introducing a large factor for a substantial decrease in the insulation property.

The present invention is contemplated to solve the aforementioned problems associated with the prior art, and provide a flame retardant epoxy resin composition that has an improved heat resistance, adhesion and insulation reliability suitable for use in a printed circuit board and a multilayered interconnection board, as well as to provide a prepreg and a metal clad laminate using the same.

Namely, the present invention discloses a flame retardant epoxy resin composition suitable for printed circuit boards, comprising:

(a) an epoxy resin containing a glicidylether compound which is a condensation polymer (addition condensate) between bisphenol A or bisphenol F and formaldehyde;

(b) a condensation polymer (addition condensate) between bisphenol A and formaldehyde;

(c) a halogenated bisphenol A; and (d) a hardening accelerator, wherein a quantity of the halogenated bisphenol A contained is less than 45 weight percent inclusive relative to that of a whole solid resin weight.

Another aspect of the invention discloses a flame retardant epoxy resin composition suitable for printed circuit boards, wherein the halogenated bisphenol A is preferably a tetrabromo-2, 2-bis (4-hydroxyphenyl)propane.

Still another aspect of the invention discloses a flame retardant epoxy resin composition for printed circuit boards, wherein an equivalence weight ratio A:B between epoxy group's equivalence weight (A) of the epoxy resin and hydroxyl group's equivalence weight (B) of the halogenate bisphenol A is preferably that A:B=1:0.20 to 0.75.

Still further aspect of the invention discloses a flame retardant epoxy resin composition for printed circuit boards, wherein the hardening accelerator is preferably a compound obtained by masking an imino group of imidazole.

Then, the flame retardant epoxy resin composition according to the invention is used as a vanish which is impregnated into a base material and dried to provide for a prepreg. Further, according to the invention, a metal foil clad laminate is provided using more than one sheet of the aforementioned prepreg, and by cladding a metal foil on one surface or both surfaces thereof, laminating the same, then heating under pressure. This metal foil clad laminate can be fabricated into a printed circuit board by processing the metal foil into a circuit pattern. Further, the aforementioned prepreg can be used as inter-layer insulation between respective internal laminations, or between the internal lamination and the metal foil as well.

DETAILED DESCRIPTION OF THE INVENTION

The epoxy resin of (a) described above contains as its essential element the glicidylether compound obtained as a condensation product of bisphenol A or bisphenol F with formaldehyde in an amount of 1 to 100 weight part, wherein there is no limit for the molecular weight of the epoxy resin. As for the other epoxy resin components to be used other than the preceding epoxy resin, any type of epoxy resins can be used without limitation. The epoxy resin according to the invention using the glicidylether compound that is the condensate product of bisphenol A or bisphenol F with formaldehyde features a faster curing speed, an improved crosslinking density and a higher Tg compared with those of a phenol novolac type epoxy resin or cresol novolac type epoxy resin which is used alone.

Another type of epoxy resin that can be used together with the epoxy resin according to the invention includes a bisphenol A type epoxy resin, bisphenol F type epoxy resin, bisphenol S type epoxy resin, phenol novolac type epoxy resin, cresol novolac type epoxy resin, salicylaldehyde novolac type epoxy resin, alicyclic epoxy resin, glicydyl esther type epoxy resin, glicydylamine type epoxy resin, hydantoin type epoxy resin, isocyanate type epoxy resin, aliphatic chain type epoxy resin, and their haloganates and hydrites, and wherein a plurality types thereof can be used in combination as well. As for a method of mixing these epoxy resins and a temperature therefor, there is no limitation.

As for the molecular weight of the polymer condensate of bisphenol A and formaldehyde of (b), there is no particular limitation, and a bisphenol A monomer a be contained as well. When a conventional phenol resin is used as a curing agent for the epoxy resin, heating discoloring of the cured substance becomes a problem. According to the invention, however, because the polymer condensate of bisphenol A and formaldehyde is used, the problem of heating discoloring does not occur. A mixing content thereof is not limited in particular, however, preferably its mixing ratio is 1 to 100 weight part relative to 100 weight part of the epoxy resin. Further, phenol resin such as phenol novolac resin or the like may be added within an extent that does not impair the effect and advantage of the invention.

Halogated bisphenol A of (c) is expressed by the following chemical formula 1, wherein R represents hydrogen or halogen, and at least one R indicates a halogen compound, for example, such as a tetra-bromo-bisphenol A, tetra-chloro-bisphenol A and the like. In order to provide for the flame retardation, tetra-bromobisphenol A is preferably used.
[Chemical Formula 1]

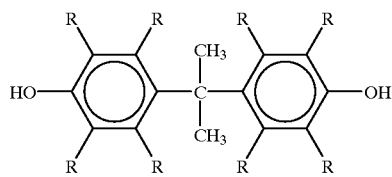

Addition of the halogenate bisphenol A of the invention is intended not only to provide for the flame retardency but also to improve adhesiveness of the cured product. In order to improve these properties while retaining the heat resistance, a mixing weight of halogenate bisphenol A is considered preferably to be 45 weight percent or less relative to a whole solid resin weight. Further, as to an equivalent weight ratio (A:B) between an epoxy group equivalent weight (A) for the epoxy resin in (a) as well as other epoxy resin used elsewhere and a hydrate group equivalent weight (B) of the halogenate bisphenol A is preferably that A:B= 1:0.25 to 0.70. In excess of the aforementioned range for the mixing weight percent of the halogenate bisphenol A, the adhesiveness with the metal foil and the heat resistance are caused to drop substantially, thereby failing to realize the intended improvement of the insulation property of the invention.

In case an adequate flame retardency cannot be achieved by addition of the halogenate bisphenol A alone, a so-called flame retardant agent such as a tetraphenylphosphine or antimony trioxide can be compounded together.

As a hardening accelerator used in (d) according to the invention, an imidazole compound, organic phosphorus compound, third-class amine, fourth-class ammonium salt of the like are used. However, when an imidazole compound obtained by masking its imino group with acrylonitrile, isocyanate, melamine, acrylate, epoxy or the like, there can be provided a varnish and a prepreg having an excellent pot life stability. The imidazole compound used here includes an imidazole, 2-ethylimidazole, 2-ethyl-4-methylimidazole, 2-phenylimidazole, 2-undecylimidazole, 1-benzyl-2-methylimidazole, 2-heptadecylimidazole, 4,5-diphenylimidazole, 2-methylimidazoline, 2-ethyl-4-methylimidazoline, 2-phenylimidazoline, 2-undecylimidazoline, 2-heptadecylimidazoline, 2-isopropylimidazole, 2,4-dimethylimidazole, 2-phenyl-4-methylimidazole, 2-ethylimidazoline, 2-isopropylimidazoline, 2,4-dimethylimidazoline, 2-phenyl-4-methylimidazoline, and the like. The masking agent used here includes acrylonitrile, phenylendiisocyanate, toluendiisocyanate, naphthalendiisocyanate, hexamethylendiisocyanate, methylenebisphenylisocyanate, melamineacrylate, various types of epoxies and the like.

Several types of these hardening accelerators can be used in combination, and a mixing content of these hardening accelerators is preferably 0.01 to 5 weight part with respect to 100 weight part of the epoxy resin. At less than 0.01 weight part thereof, the effect of the hardening accelerator is negligible, and in excess of 5 weight part, the pot life stability drops remarkably.

These flame retardant epoxy resin compositions for use in the printed circuit boards are diluted in a solvent and used as a varnish. This solvent, which is not limited to any particular type, includes, for example, acetone, methyl-ethyl ketone, toluene, xylene, methylisobutile ketone, ethyl acetate, ethylenglycol-monomethyl-ether, N,N-dimethylformamide, methanol, ethanol and the like. Several types of these solvent can be used in mixture.

The components of (a), (b), (c) and (d) described above are essential components for the flame retardant epoxy resin composition for use in the printed circuit boards, however, other substances may be compounded as well.

An inorganic filler can be added to the flame retardant epoxy resin composition for the printed circuit boards according to a particular object of use. Any inorganic filler can be used without limitation, which may include, for example, various types of whiskers made of calcium carbonate, alumina, titanium oxide, mica, aluminum carbonate, aluminum hydrate, magnesium silicate, aluminum silicate, silica, glass fiber, boric acid aluminum, silicon carbide and the like. Further, several types of them may be used in combination with their mixing ratios varied at discretion.

A varnish obtained by compounding the above-mentioned respective compositions is impregnated into a base material, and dried in an oven at temperatures from 80° C. to 200° C. so as to obtain a prepreg. Although it is not particularly specified, fiber materials such as woven or non-woven fabric cloths are normally used as the base material. The fiber base material includes inorganic fibers made of such as glass, alumina, boron, silica-alumina glass, Tyranno®(Ube-kosan KK), silicon carbonate, silicon nitride, zirconia and the like, or organic fibers made of alamid, polyether-etherketone, polyetherimide, polyether-sulfon, cellulose and the like, or a mix spinning therebetween. Preferably, woven or nonwoven clothes of glass fiber are used.

At least one or more sheets of this prepreg are laminated, then a metal foil such as a copper foil or aluminum foil is clad on one or both surfaces of the prepreg, then heated at 150° C. to 200° C. under pressures from 0.5 MPa to 10 MPa so as to obtain a metal foil clad laminate. Further, this prepreg is also used as an interlayer insulation in combination with an internal circuit board and/or a metal foil to manufacture a multilayer printed interconnection board.

DESCRIPTION OF THE PREFERRED EMBODIMENTS

The features and advantages of the invention will be described more in detail by way of some preferred embodiments and comparison examples.

Embodiment 1

Bisphenol A of 1000 g, 37 weight % formalin of 220 g, and oxalic acid of 10 g are poured into a four-ported flask having a cooling tube and a stirrer, then they are recirculated for two hours therein to proceed a chemical reaction therebetween, then they are dehydrated and condensed to obtain a bisphenol A novolac resin [A], which is a polycondensate of bisphenol A and formaldehide. Using this condensate and compounding with the following compositions as specified below, a varnish of a flame retardant epoxy resin composition for printed circuit boards is manufactured.

Epiclon N-865 (bisphenol A novolac type epoxy resin, epoxy group equivalent weight 205 g/eq.; produced by Dainihon Ink Kagagu-kogyo KK) 100 weight part;

Bisphenol A novolac resin (hydroxyl group equivalent weight 114 g/eq.) [A] 36 weight part;

Tetrabromobisphenol A (hydroxyl group equivalent weight 272 g/eq.) 47 weight part;

Hardening accelerator (2-ethyl-4-methylimidazole; 2E4MZ) 0.5 weight part; and

Methylethylketon 100 weight part.

Embodiment 2

Using the bisphenol A novolac resin [A] of the embodiment 1, and compounding with the following components as specified below, a varnish of a flame retardant epoxy resin composition for printed circuit boards is provided.

Epiclon N-865 (bisphenol A novolac type epoxy resin, manufactured by Dainihon Ink Kagaku Kogyo KK.) 100 weight part;

Bisphenol A novolac resin [A] 20 weight part;

Tetrabromobisphenol A 98 weight part;

Hardening accelerator (2-ethyl-4-methyimidazole; 2E4MZ) 0.3 weight part; and

Methylethylketon 100 weight part.

Embodiment 3

Using the bisphenol A novolac resin [A] of the embodiment 1, and blending with the following compositions as specified below, a varnish of a flame retardant epoxy resin composition for printed circuit boards is provided.

Epiclon N-865 (bisphenol A novolac type epoxy resin, manufactured by Dainihon Ink Kagaku Kogyo KK.) 100 weight part;

Bisphenol A novolac resin [A] 39 weight part;

Tetrabromobisphenol A 27 weight part;

Hardening accelerator (2-ethyl-4-methyimidazole; 2E4MZ) 0.8 weight part; and

Methylethylketon 100 weight part.

Embodiment 4

Using the bisphenol A novolac resin [A] of the embodiment 1, and compounding with the following components as specified below, a varnish of a flame retardant epoxy resin composition for printed circuit boards is provided.

Epiclon N-865 (bisphenol A novolac type epoxy resin, manufactured by Dainihon Ink Kagaku Kogyo KK.) 100 weight part;

Bromide bisphenol A epoxy resin 18 weight part;

Bisphenol A novolac resin [A] 46 weight part;

Tetrabromobisphenol A 36 weight part;

Hardening accelerator (2-ethyl-4-methyimidazole; 2E4MZ) 0.6 weight part; and

Methylethylketon 100 weight part.

Embodiment 5

Blending LX-1006 (isocyanate mask imidazole: trademark of Daiichi Kogyo Seiyaku KK) in 0.5 weight part as a hardening accelerator instead of 2E4MZ used in the embodiment 1, a varnish of flame retardant epoxy resin composition for printed circuit boards is manufactured.

Embodiment 6

Blending LX-1006 (isocyanide mask imidazole) in 0.6 weight part as a hardening accelerator instead of 2E4MZ used in the embodiment 4, a varnish of flame retardant epoxy resin composition for printed circuit boards is manufactured.

COMPARISON EXAMPLE 1

Using the bisphenol A novolac resin [A] of the embodiment 1, and blending with the following components as specified below, a varnish of flame retardant epoxy resin composition for printed circuit boards is manufactured as a comparison example 1.

Epiclon N-865 (bisphenol A novolac type epoxy resin; trademark of Dainihon Ink Kagaku Kogyo KK) 100 weight part;

Bisphenol A novolac resin [A] 22 weight part;

Tetrabromobisphenol A 107 weight part;

Hardening accelerator (2-ethyl-4-methylimidazole; 2E4MZ) 0.5 weight part; and

Methyl-ethyl-keton 100 weight part.

COMPARISON EXAMPLE 2

Using the bisphenol A novolac resin [A] of the embodiment 1, and blending with the following components as specified below, a varnish of flame retardant epoxy resin composition for printed circuit boards is manufactured as a comparison example 1.

Epiclon N-865 (bisphenol A novolac type epoxy resin; trademark of Dainihon Ink Kagaku Kogyo KK) 100 weight part;

Bisphenol A novolac resin [A] 30 weight part;

Tetrabromobisphenol A 21 weight part;

Hardening accelerator (2-ethyl-4-methylimidazole; 2E4MZ) 0.5 weight part; and

Methyl-ethyl-keton 100 weight part.

COMPARISON EXAMPLE 3

Using dicyandiamide as a hardening accelerator, and blending with the following components as specified below, a varnish is obtained as a comparison example 2.

Araldite 8011LA (bisphenol A group brominated epoxy resin; bromine content of 20 weight %, epoxy group equivalent weight of 475 g/eq.: trademark of Nihon Ciba Geigi KK) 80 weight part;

ESCN195 (cresol novolac type epoxy resin, epoxy group equivalent weight of 197 g/eq: trademark of Sumitomo Kagaku Kogyo KK) 20 weight part;

Dicyandiamide 4 weight part;

Benzyldimethylamine 0.5 weight part;

Methylethylketone 30 weight part; and

Etylenglycolmonomethylether 40 weight part.

COMPARISON EXAMPLE 4

A varnish as a comparison example 4 is obtained using ESCN195 in 100 weight part instead of epiclon N-865 of embodiment 1.

COMPARISON EXAMPLE 5

A varnish as a comparison example 5 is obtained using phenol novolac resin H-1 (softening temperature at 84° C.; trademark of Showa Kasei KK) in 30 weight part instead of bisphenol A novolac resin [A] used in embodiment 1.

Varnishes of the flame retardant epoxy resin compositions for printed circuit boards described above are impregnated into a glass cloth of 0.2 mm thick (210 g/cm$^2$), then heated and dried at 130° C. for 5–10 minutes, and a prepreg having a resin part of 41 weight % is obtained. Four sheets of this prepreg are laminated, then on both surfaces thereof a copper foil of 18 μm thick is overlaid, then pressed under pressure of 4.0 MPa at 170° C. for 90 minutes so as to obtain a double-sided copper foil clad laminate.

Shelf life of the prepregs obtained above, as well as Tg, soldering heat resistance, galvanic corrosion resistance of the double-sided copper foil clad laminates, and also peel-off strength (adhesion) of the copper foils are evaluated. The result of evaluations is indicated in Tables 1 and 2 along with their compounding ratios.

Test processes adopted are as follows.

The shelf life stability of the prepregs is evaluated by comparing a gelling time measured at 160° C. in an initial stage of shelf life (after one day on the shelf) and a gelling time measured after 60 days on the shelf stored at 25° C. A retention ratio for retaining the initial gelling time is defined in % by calculating a gelling time after 60 days of shelf life.

Test samples used for evaluation of the copper foil clad laminates are prepared by copper foil etching except for those used in testing of galvanic corrosion resistance and copper foil peel-off strength.

Tg (glass transition temperature) is calculated using a test piece of 5 cm×5 cm size and by thermomechanical analysis (TMA), and from a temperature at a bending point on a thermal expansion curve in the plate thickness direction obtained at a rate of temperature rise of 5° C./min.

The water absorption ratio is calculated from a weight change in a laminate which is prepared by etching its whole surface, and retaining the same in a pressure cooker tester for 3 hours.

As to the solder heat resistance, a laminate the whole surface of which is etched is held in the pressure cooker tester for 3 hours, then immersed in a solder at 260° C. for 20 seconds before subjecting to a visual examination of its appearance. "OK" in the table depicts that there is observed no measling nor swell, and "NG" depicts that measling or swell is observed.

As to the testing of galvanic corrosion resistance, through-holes having a wall gap of 300 μm between respective holes are drilled using a drill of 0.4 mm diameter, at 80,000 rmp and at a feed speed of 3,200 mm/m, then a voltage of 100 V is applied in an atmosphere of 85° C./85%RH, and then a time until conduction break-down is measured. As a result of examination of the test pieces the insulation of which were broken down, it is confirmed that all of their break-down occurred at the positions of conductive anodic filaments (CAF) between the through-holes.

As for the copper foil peeling strength, the copper foil is etched to form lines of 10 mm width, then is pulled in a direction of 90° relative to its surface at 50 mm/m to determine its strength of adhesion.

TABLE 1

|  | Emb. 1 | Emb. 2 | Emb. 3 | Emb. 4 | Emb. 5 | Emb. 6 |
|---|---|---|---|---|---|---|
| Epiclon N-865 | 100 | 100 | 100 | 100 | 100 | 100 |
| Brom. bis-phenol A epoxy | — | — | — | 18 | — | 18 |
| Bisphenol A novolac epoxy[A] | 36 | 20 | 39 | 46 | 36 | 46 |
| Tetra bromo bisphenol A | 47 | 98 | 27 | 36 | 47 | 36 |
| 2E4Mz | 0.5 | 0.3 | 0.8 | 0.6 | — | — |
| LX-1006 | — | — | — | — | 0.5 | 0.6 |
| MEK | 100 | 100 | 100 | 100 | 100 | 100 |
| Hydroxyl group eq. wt of halog. bisphenol A to epoxy group eq. wt | 0.35 | 0.74 | 0.20 | 0.27 | 0.35 | 0.27 |
| Weight % of tetrabromobisphenol A to all solid resin wt. | 26 | 45 | 16 | 18 | 26 | 18 |
| Gel time(s) of prepreg |  |  |  |  |  |  |
| [Init.] | 130 | 128 | 132 | 125 | 127 | 123 |
| [After 60 days] | 106 | 98 | 110 | 103 | 121 | 117 |
| Ret. rate (%) [60 days/Init.] | 82 | 77 | 83 | 82 | 95 | 95 |
| Tg (TMA, ° C.) | 178 | 173 | 181 | 182 | 180 | 183 |
| Water absorp. (wt %) | 0.24 | 0.26 | 0.19 | 0.23 | 0.23 | 0.22 |
| Solder heat resistance | OK | OK | OK | OK | OK | OK |
| Gal. corr. resistance (hr.) | >1000 | >1000 | >1000 | >1000 | >1000 | >1000 |
| Foil peel stren. (KN/m) | 1.4 | 1.6 | 1.3 | 1.3 | 1.5 | 1.5 |

TABLE 2

|  | Comp. 1 | Comp. 2 | Comp. 3 | Comp. 4 | Comp. 5 |
|---|---|---|---|---|---|
| Epiclon N-865 | 100 | 100 | — | — | 100 |
| Araldite 8011 | — | — | 80 | — | — |
| ESCN195 | — | — | 20 | 100 | — |
| Bisphenol A novolac resin [A] | 22 | 30 | — | 36 | — |
| Tetrabromo bisphenol A | 107 | 21 | — | 47 | 47 |
| Phenolnovolac resin (H-1) | — | — | — | — | 30 |
| Benzyldimethyl amine | — | — | 0.5 | — | — |
| Dicyandiamide | — | — | 4 | — | — |
| 2E4MZ | 0.5 | 0.5 | — | 0.5 | 0.5 |

TABLE 2-continued

|  | Comp. 1 | Comp. 2 | Comp. 3 | Comp. 4 | Comp. 5 |
|---|---|---|---|---|---|
| MEK | 100 | 100 | 30 | 100 | 100 |
| Ethylenglycolmono methylether | — | — | 40 | — | — |
| Hydroxyl group eq. wt (wt %) of halogen. bisphenol A to epoxy group eq. wt | 0.81 | 0.16 | — | 0.34 | 0.35 |
| Ratio (wt %) of tetrabromo-bisphenol A to all solid resin wt | 47 | 14 | — | 26 | 26 |
| Gel time(s) of prepreg |  |  |  |  |  |
| [Initial] | 138 | 124 | 95 | 88 | 120 |
| [After 60 days] | 105 | 95 | 62 | 63 | 95 |
| Retention [%, 60 days/Init.] | 76 | 77 | 65 | 72 | 79 |
| Tg (TMA, ° C.) | 168 | 170 | 130 | 160 | 158 |
| Water absorption (wt %) | 0.33 | 0.18 | 0.62 | 0.30 | 0.31 |
| Solder heat resistance | NG | OK | OK | OK | OK |
| Galv. corr. resistance (hour) | >1000 | >1000 | 250 | 880 | 950 |
| Foil peel streng. (KN/m) | 1.7 | 1.0 | 1.8 | 1.2 | 1.2 |

Comparison example 1 contains the same components as the embodiment of the invention. However, because its weight % of mixing content of tetrabromobisphenol A which is a halogenide bisphenol A of (d) is 47 weight % of a total solid resin weight, which is greater than 45 weight % of the embodiment, and in addition, because its equivalent weight ratio (A/B) of epoxy group equivalent weight (A) of the epoxy resin relative to hydroxyl group equivalent weight (B) of haloganate bisphenol A is that A/B=1/0.81, which is outside of a preferred range that A/B=1/(0.20 to 0.75), its Tg becomes low, and its solder heat resistance as well as water absorption rate become inferior. Comparison example 2, although it contains the same components as the embodiment of the invention likewise the comparison example 1, because an equivalent weight ratio (A/B) of its epoxy group equivalent weight (A) of the epoxy resin relative to hydroxyl group equivalent weight (B) of haloganate bisphenol A is that A/B=1/0.16, which is outside of the preferred range that A/B=1/(0.20 to 0.75), its Tg becomes low. However, because its compounding content of tetrabromobisphenol A is 20 weight % relative to a total solid resin weight, less than 45 weight % of the embodiment, its water absorption ratio and solder heat resistance are approximately the same as those of the embodiment.

Comparison example 3, which uses brominated epoxy resin of bisphenol A group which does not contain the epoxy resin of the invention in combination with cresol novolac type epoxy resin, and uses dicyandiamide as its curing agent, is inferior in Tg, water absorption ratio and galvanic corrosion resistance.

Comparison example 4, which is prepared using the cresol novolac type epoxy resin which does not contain the epoxy resin of the invention, and blending the same with a polycondensate of (b) bisphenol A and formaldehyde, (c) haloganated bisphenol A, and (d) hardening accelerator used in the invention, is inferior in Tg, the water absorption rate and galvanic corrosion resistance.

Comparison example 5 which is prepared by compounding the phenol novolac resin instead of the polycondensate of (b) bisphenol A and formaldehyde used in the invention is inferior in Tg, the water absorption rate, galvanic corrosion resistance and copper foil peeling strength.

In contrast to these comparison examples, the preferred embodiments of the invention which consists of: (a) the epoxy resin containing glicydyl ether compound which is a polycondensate of bisphenol A and formaldehyde; (b) the polycondensate of bisphenol A and formaldehyde; (c) haloganated bisphenol A; and (d) a hardening accelerator, wherein its compounding content of (c) is specified to be less than 45 weight % of a total resin solid weight such that its Tg becomes as high as 173° C. to 183° C., its water absorption rate as low as 0.19 to 0.24 wt %, and its solder heat resistance, galvanic corrosion resistance and copper foil peeling strength are substantially improved. Further, with embodiments 4 and 5 which use a hardening accelerator compound of imidazole in which the imino group thereof is masked or blocked, approximately 95% of the gel time of its prepreg (pot life stability) is retained after 90 days of storage. This is better than the case of the compound in which the imino group is not masked, and its pot life stability of the prepreg is 77 to 82%.

From the results as described above and indicated with reference to the preferred embodiments 1–6, it is confirmed that the metal foil clad laminates which have used the flame retardant epoxy resin compositions for printed circuit boards having (c) haloganated bisphenol A mixed less than 45 weight % according to the invention would not lower Tg and heat resistance, and would not increase the water absorption ratio, thereby demonstrating an excellent adhesiveness and galvanic corrosion resistance.

Further, the flame retardant epoxy resin compositions for printed circuit boards, the prepregs and the metal foil clad laminates using the same compositions of the invention have an excellent shelf life stability required for providing the prepregs, which when used for the laminate can exhibit excellent adhesiveness, galvanic corrosion resistance and the like without impairing its high Tg, high heat resistance and the like.

What is claimed is:

1. A flame retardant epoxy resin composition for a printed circuit board, comprising:
    (a) an epoxy resin comprising a glicydyl ether compound;
    (b) a condensate of bisphenol A and formaldehyde;
    (c) halogenated bisphenol A; and
    (d) a hardening accelerator, wherein
    said halogenated bisphenol A is compounded in less than 45 weight % inclusive with respect to a total solid resin weight.

2. A flame retardant epoxy composition for a printed circuit board according to claim 1, wherein said halogenated bisphenol A is 2,2'-bis(4-hydroxy tetrabromophenyl) propane.

3. A flame retardant epoxy resin composition for a printed circuit board according to claim 1, wherein an equivalent weight ratio A:B for an epoxy group equivalent weight (A) of the epoxy resin and a hydroxyl group equivalent weight (B) of the halogenated bisphenol A is defined as follows:

$$A:B=1:0.20 \text{ to } 0.75.$$

4. A flame retardant epoxy resin composition for a printed circuit board according to claim 1, wherein said hardening accelerator is an imidazole compound having a masked imino group.

5. A flame retardant epoxy resin according to claim 1, wherein said glicidyl ether is a condensate of bisphenol A or bisphenol F with formaldehyde.

6. A flame retardant epoxy resin according to claim 1 wherein said halogenated bisphenol A is tetrabromobisphenol A or tetrachlorobisphenol A.

7. A flame retardant epoxy resin according to claim 1, wherein said hardening accelerator is selected from the group consisting of an organic phosphorous compound, an amine, an ammonium salt, and combinations thereof.

8. A prepreg comprising a base material impregnated with a varnish, wherein said varnish comprises a flame retardant material according to claim 1.

9. A metal foil clad laminate comprising a prepreg according to claim 8 having a metal foil clad on at least one surface.

10. A process for preparing a prepreg, comprising:

preparing a varnish comprising the flame retardant epoxy resin composition according to claim 1 as a varnish; and impregnating said varnish into a base material; and drying said impregnated base material.

11. A process for preparing a metal foil clad laminate, comprising:

depositing a metal foil onto at least one surface of a prepreg according to claim 10; and heating said metal foil under pressure.

* * * * *